(12) United States Patent
Abuku

(10) Patent No.: US 7,474,381 B2
(45) Date of Patent: Jan. 6, 2009

(54) EXPOSURE APPARATUS AND DEVICE MANUFACTURING METHOD

(75) Inventor: Yuji Abuku, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/104,757

(22) Filed: Apr. 17, 2008

(65) Prior Publication Data

US 2008/0266537 A1   Oct. 30, 2008

(30) Foreign Application Priority Data

Apr. 27, 2007   (JP)   ............................. 2007-117897

(51) Int. Cl.
G03B 27/42   (2006.01)
G03B 27/52   (2006.01)
G03B 27/58   (2006.01)
G03B 27/32   (2006.01)

(52) U.S. Cl. .............................. 355/53; 355/55; 355/72; 355/77

(58) Field of Classification Search ................... 355/53, 355/55, 72, 77
See application file for complete search history.

(56) References Cited

U.S. PATENT DOCUMENTS 7,292,311 B2   11/2007   Kurosawa
2002/0145716 A1*   10/2002   Kurosawa ..................... 355/55
2002/0176082 A1*   11/2002   Sakakibara et al. ......... 356/400
2007/0250290 A1*   10/2007   Kurosawa ..................... 702/150

FOREIGN PATENT DOCUMENTS

JP   2005-129674 A   5/2005

\* cited by examiner

*Primary Examiner*—Alan A Mathews
(74) *Attorney, Agent, or Firm*—Canon U.S.A., Inc. I.P. Division

(57) ABSTRACT

An exposure apparatus configured to expose a substrate to radiant energy via an original plate while scanning of the original plate and the substrate are performed including a projection optical system configured to project light from the original plate onto the substrate, an original plate configured to hold the original plate and to be moved a substrate stage configured to hold the substrate and to be moved a measurement device configured to measure a position of a surface of a substrate facing the projection optical system in a direction of an optical axis of the projection optical system a processor configured to control a movement of the original plate stage, a movement of the substrate stage, and an operation of the measurement device, and an input device configured to input information about a measurement portion in the surface to be measured by the measurement device. The processor is configured to cause the measurement device to perform measurement of a position of the surface with respect to a measurement portion determined by the information, to cause the scanning to start after the measurement, and to cause the substrate stage to move in the direction of the optical axis during the scanning based on the position of the surface obtained by the measurement.

5 Claims, 15 Drawing Sheets

CH1　　　　CH2　　　　CH3

~501
CH4　　　　CH5　　　　CH6

CH7　　　　CH8　　　　CH9

EXPOSURE APPARATUS AND DEVICE MANUFACTURING METHOD

BACKGROUND OF THE INVENTION

1. Field of the Invention

The present invention relates to an exposure apparatus for manufacturing a device such as a semiconductor device or a liquid crystal device, and more particularly, to an exposure apparatus configured to expose a substrate to radiant energy with an original plate (also referred to as reticle or mask) and the substrate scanned in a scanning direction traversing an optical axis of a projection optical system.

2. Description of the Related Art

In transferring a circuit pattern onto a wafer, a reticle having an integrated circuit pattern is illuminated with light emitted from an optical system and the illuminated pattern is projected onto the wafer by a projection optical system. During this process, it is necessary to adjust a focus of the projection optical system so that the pattern on the reticle is formed on the wafer with precision.

However, depending on a pattern formed on the wafer, the focus may not be correctly measured at the exposure position. In such a case, if the apparatus is a one-shot exposure type stepper, a focus on a substrate position different from an exposure position is measured before the exposure. This technique is called "shift focus". However, regarding a scanning exposure type scanner, since a focus measurement and exposure of the substrate are performed while the substrate is being scanned, a shift focus method similar to that for the stepper is not utilized.

Thus, in a conventional technique, it is possible that a measurement point overlays a scribe line and proper measurement cannot be performed. Further, as a special case, if the wafer includes a test element group (TEG), which is commonly formed on the wafer together with the chip, its exposure area may be set at an X position considerably distant from a line that goes through the center of the reticle in the scanning direction (Y direction) (see FIG. 8A) or its exposure area having a short Y width may be set at a position shifted in the Y direction from the center of the reticle (see FIG. 8B). In these cases, the focus is adjusted based on focus measurement information of a shot area near the shot area for the exposure. However, in some cases, the focus is not precisely adjusted based on the focus measurement information.

SUMMARY OF THE INVENTION

The present invention is directed to an exposure apparatus which is capable of adjusting focus with precision in the cases as described above.

According to an aspect of the present invention, an exposure apparatus configured to expose a substrate to radiant energy via an original plate while scanning of the original plate and the substrate are performed including a projection optical system configured to project light from the original plate onto the substrate, an original plate configured to hold the original plate and to be moved a substrate stage configured to hold the substrate and to be moved a measurement device configured to measure a position of a surface of a substrate facing the projection optical system in a direction of an optical axis of the projection optical system a processor configured to control a movement of the original plate stage, a movement of the substrate stage, and an operation of the measurement device, and an input device configured to input information about a measurement portion in the surface to be measured by the measurement device. The processor is configured to cause the measurement device to perform measurement of a position of the surface with respect to a measurement portion determined by the information, to cause the scanning to start after the measurement, and to cause the substrate stage to move in the direction of the optical axis during the scanning based on the position of the surface obtained by the measurement.

According to another aspect of the present invention, a method for manufacturing a device includes exposing a substrate to radiant energy using the above-described exposure apparatus, developing the exposed substrate, and processing the developed substrate to manufacture the device.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

Figure 2:
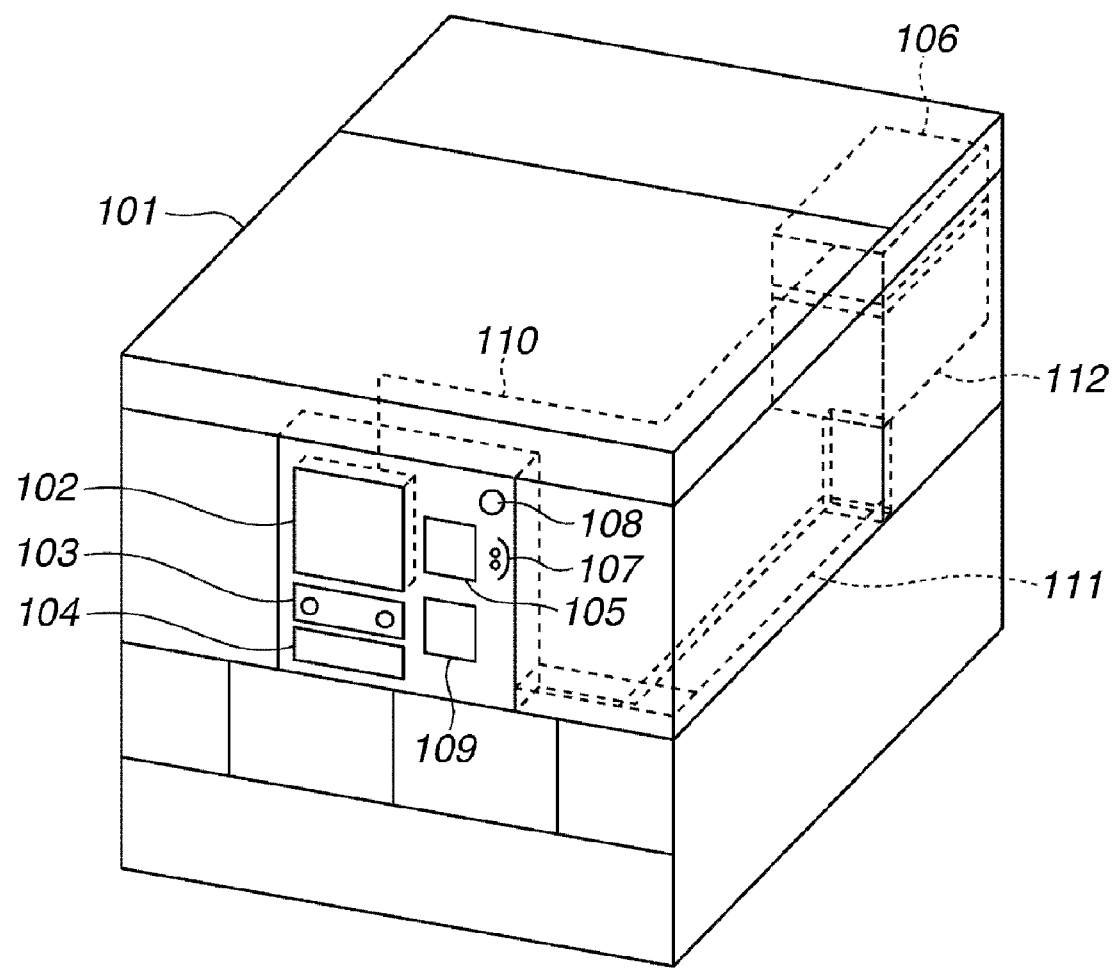
FIG. 2 is a perspective view of an external appearance of the scanning exposure apparatus illustrated in FIG. 1.

FIG. 2 is a perspective view of an example external appearance of a scanning exposure apparatus according to an exemplary embodiment of the present invention. As shown in FIG. 2, the scanning exposure apparatus includes a temperature regulating chamber 101 configured to control ambient temperature of the apparatus main body, an engineering workstation (EWS) main body 106 which is arranged in the temperature regulating chamber 101 and includes a central processing unit (CPU) used for controlling the apparatus main body, and further an EWS display 102 configured to display predetermined information about the apparatus. Further, the scanning exposure apparatus includes a monitor TV 105 configured to display image information which is obtained through an imaging unit, an operation panel 103 through which a predetermined input is made to the scanning exposure apparatus, and a console unit including an EWS keyboard 104. Furthermore, the scanning exposure apparatus includes, an ON-OFF switch 107, an emergency stop switch 108, various types of switches 109 (e.g., a mouse), a local area network (LAN) communication cable 110, an exhaust duct 111 used for exhausting heat generated from the console unit, and an exhaust unit 112 used for discharging air from the temperature regulating chamber 101. The main body of the scanning exposure apparatus is set in the temperature regulating chamber 101.

The Engineering Workstation (EWS) display 102 including a thin flat-type display such as an electroluminescence (EL) display, a plasma display, or a liquid crystal display, is set in the front face of the temperature regulating chamber 101, and connected to the EWS main body 106 via the LAN communication cable 110. The operation panel 103, the EWS keyboard 104, and the monitor TV 105 are also set in the front face of the temperature regulating chamber 101 so that a console operation similar to that for the conventional apparatus can be performed from the front face of the temperature regulating chamber 101.

Figure 1:
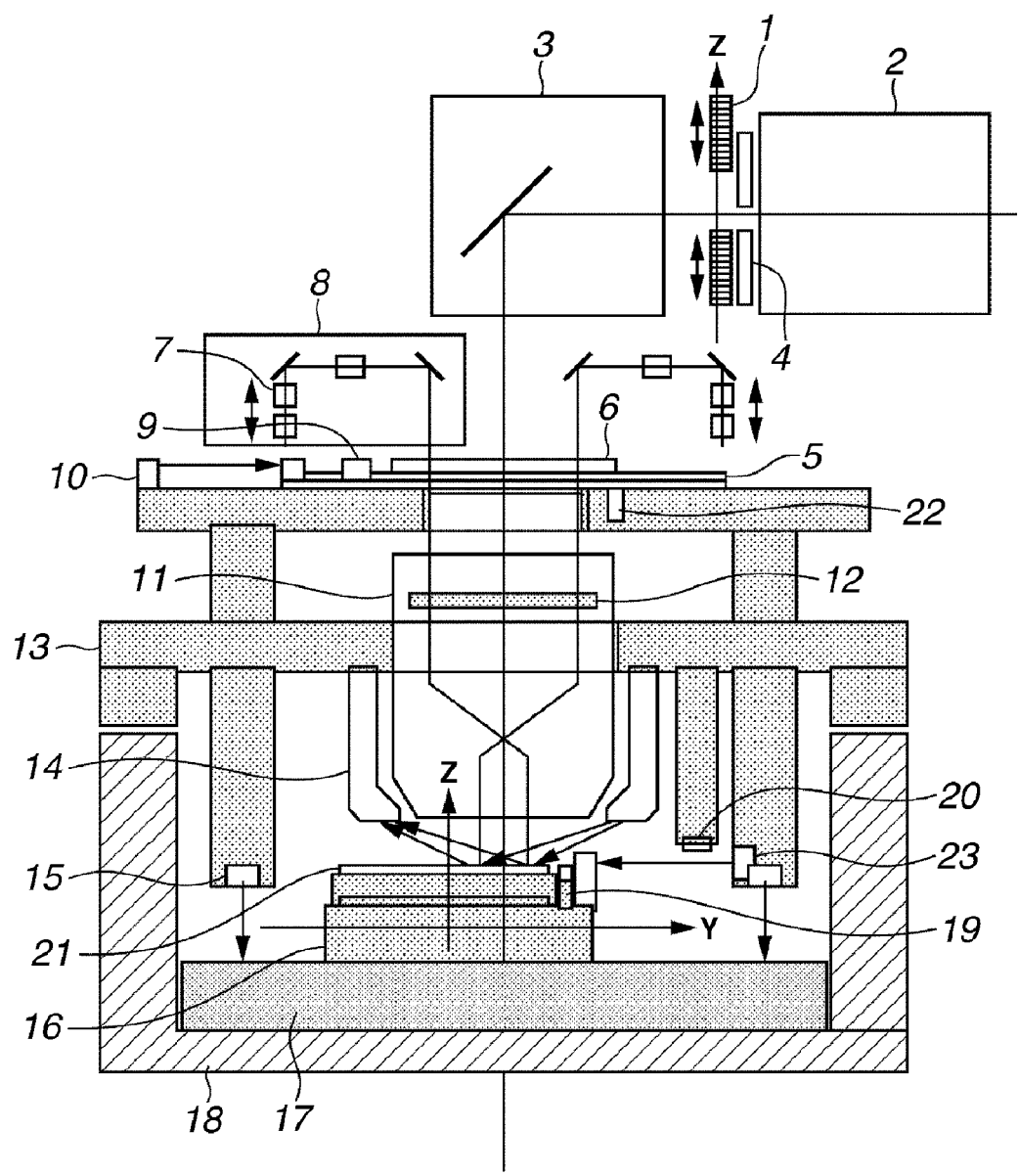
FIG. 1 illustrates an example configuration of a scanning exposure apparatus according to an exemplary embodiment of the present invention.
Figure 3:
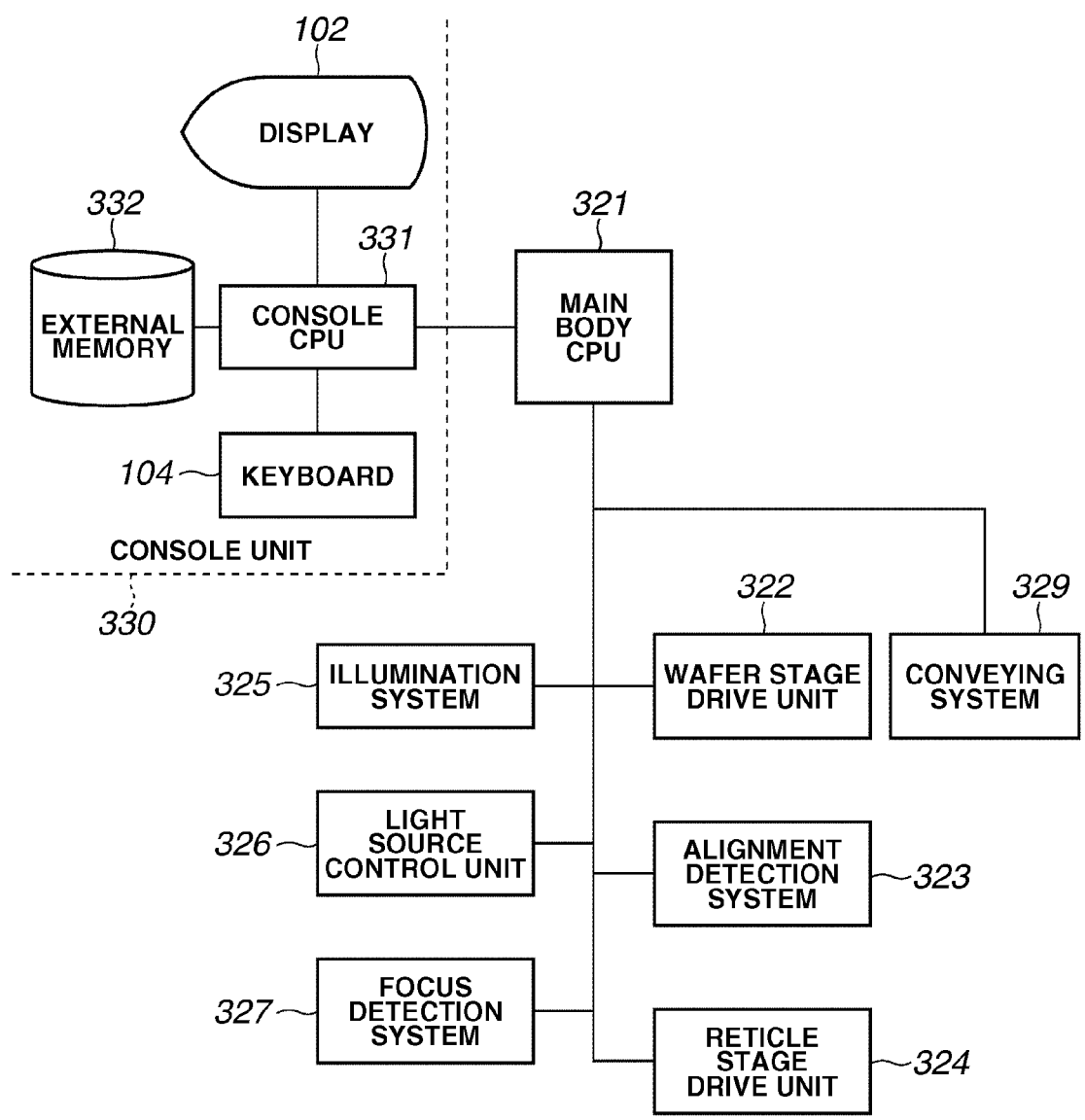
FIG. 3 is a block diagram illustrating an example electric circuit configuration of the scanning exposure apparatus illustrated in FIG. 1.

FIG. 3 is a block diagram illustrating an electric circuit configuration of the scanning exposure apparatus illustrated in FIG. 1. In FIG. 3, a central processing unit (CPU) 321 is a main body CPU incorporated in the EWS main body 106. The CPU 321 controls the entire apparatus and includes a central processing unit such as a microcomputer or a minicomputer. Furthermore, the CPU 321 controls a wafer stage drive unit 322, an alignment detection system 323 configured to detect misalignment of an off-axis microscope, a reticle stage drive apparatus 324, an illumination system 325, a light source control unit 326 configured to control a shutter of a mercury lamp (not shown) and a laser beam used as the exposure light, and a focus detection system 327. A conveying system 329 includes a reticle conveying apparatus (not shown) and a wafer conveying apparatus (not shown).

A console unit 330 includes the EWS display 102 and the EWS keyboard 104. The console unit 330 is used for providing various operational commands or parameters of the scanning exposure apparatus to the main body CPU 321. In other words, the console unit 330 is used for exchanging information between the operator and the scanning exposure apparatus. A console CPU 331 and an external memory 332 configured to store various job parameters are also provided. Parameters such as a mask to be used, an aperture of a masking blade, amount of exposure, layout data, and a focus-related parameter are included in the job parameters. Further, although not shown, each unit includes a CPU and a memory and is controlled by its CPU.

FIG. 1 illustrates an example configuration of the scanning exposure apparatus shown in FIG. 3. Exposure light emitted from a light source unit in the illumination system 325 illustrated in FIG. 3, such as an excimer laser, reaches a slit 4 through a first condenser lens group 2. The slit 4 narrows the exposure light into a slit-shaped beam having a dimension of about 7 mm in the Z direction. Further, the slit 4 adjusts a luminance level integrated in the Z-axis direction so that it is uniform across a predetermined range in the X-axis direction.

A masking blade 1 tracks the end of a field angle of a pattern formed on a reticle (original plate) 6 while a reticle stage (master stage) 5 and a wafer stage (substrate stage) 16 are scanned and exposed to the exposure light. The masking blade 1 prevents irradiating of a light-transmitting portion of the reticle 6 with the exposure light when the reticle stage 5 is decelerating after the pattern of the reticle 6 is transferred to a wafer (substrate) 21 so that the exposure light is not projected onto the wafer 21. The exposure light which passed through the masking blade 1 illuminates the reticle 6 on the reticle stage 5 through a second condenser lens group 3.

The exposure light which passed through the pattern of the reticle 6 forms a pattern imaging plane in the vicinity of the surface of the wafer 21 via a projection lens (projection optical system) 11. A numerical aperture (NA) diaphragm (NA-diaphragm) 12 is provided within the projection lens 11 to change an illumination mode during the exposure.

A through the lens (TTL) scope 8 which is movable in one dimension constitutes an alignment detection system 323 shown in FIG. 3. The alignment detection system 323 measures the X-, Y-, and Z-axis positions of a reticle alignment mark formed on the reticle 6 and on the wafer 21 or on a reference mark member 19 on a wafer stage 16 with respect to an absolute position reference of the TTL scope 8. A relay lens 7 is used for adjusting the focus of the TTL scope 8. By referring to a position of the relay lens 7 when the alignment mark is in best focus, the focus (position in the Z-axis or the optical axis direction) of an object to be detected can be measured.

Although two TTL scopes 8 are arranged in the Y direction in FIG. 1, actually, another TTL scope 8 is arranged in the X direction. This layout enables measuring the tilts between the reticle alignment mark and the reference mark member 19 on the wafer 21 or on the wafer stage 16 in the ωx and ωy directions. The TTL scopes 8 shown in FIG. 1 can be driven toward the center of the field angle (Y-axis direction).

The reticle stage 5 is controlled in the θ direction (rotation around the Z axis) as well as in the X and Y directions by three reticle laser interferometers 10. Although only one reticle interferometer 10 is illustrated in FIG. 1, actually, two reticle laser interferometers 10 are arranged in the Y-axis direction and one reticle laser interferometer 10 is arranged in the X-axis direction. The reticle stage 5 is movable in the X, Y, and θ directions along a guide arranged on a barrel support 13. The reticle stage 5 can move over a long stroke in the Y-axis direction in synchronization with the movement of the wafer stage 16 to perform the scanning. On the other hand, the reticle stage 5 moves within a small range in the X- and θ-axis directions. This is because the limited movement in the X- and θ-axis directions is sufficient for eliminating a positional error which is generated when the reticle 6 is held to the reticle stage 5 with vacuum suction.

The scanning exposure apparatus is structured such that a reaction force generated in driving the reticle stage 5 is absorbed by a reaction force absorption unit (not shown) which is rigidly connected to a base plate 18. Thus, the barrel support 13 is not affected by the reaction of the drive. A reticle reference plate 9 is mounted on the reticle stage 5. A mark, which can be observed by the TTL scopes 8, is formed on the reticle reference plate 9.

A focus detector 14 is configured to detect a focus. When an object to be measured is obliquely irradiated with a measurement light emitted from a light emitting device such as a laser diode, a position of a reflected light spot on the light receiving side changes depending on a position of the object to be measured in the focus direction (direction of the optical axis in the projection optical system). Thus, by measuring a barycentric position (weighted center position) of the reflected light on the light-receiving side, the focus value of a point on the wafer where the measurement light is projected (substrate surface position in the focus direction) is obtained.

The focus detector 14 measures the Z, ωx, and ωy positions of the wafer 21 or the reference mark member 19 on the wafer stage (substrate stage) 16 without passing through the projection lens 11 and at a high speed regardless of the presence or absence of the mark. The focus detector 14 is used for detecting the focus (substrate surface position) during the exposure while the reticle stage 5 and the wafer stage 16 are scanned in synchronization with each other. The focus detector 14 performs self calibration by comparing the reference mark 19 on the wafer stage 16 measured by the TTL scopes 8 with the reference mark 19 measured by the focus detector 14 to guarantee a long-term stability of the measurement precision.

An off-axis scope 20 has a single lens focus measurement function and an X/Y direction alignment error measurement function. To align the wafer 21 in a normal mass production job, the off-axis scope 20 performs global tilt measurement and global alignment measurement. A global tilt correction and a global alignment correction are performed simultaneously when the wafer stage 16 is stepped to a position where the exposure area on the wafer 21 comes under the projection lens 11.

The barrel support 13 serves as a base onto which high-precision measurement devices of the exposure apparatus are fixed. The barrel support 13 is positioned to slightly levitate above the base plate 18 which is directly set on the floor. Since the focus detector 14 and the TTL scopes 8 are fixed to the barrel support 13, results obtained by these measurement devices represent relative distances from the barrel support 13.

An inter-support-member laser interferometer 15 measures a relative positional relationship between the barrel support 13 and a stage surface plate 17. According to the present exemplary embodiment, the wafer stage 16 is controlled such that a sum of a measurement result obtained by the inter-support-member interferometer 15 and a measurement result obtained by a triaxial Z sensor (not shown) mounted on the wafer stage 16 equals a target value designated by a host sequence. With this operation, the wafer 21 on the wafer stage 16 is kept at a position that satisfies the target value designated by the host sequence in the focus direction (i.e., axis direction) with respect to the barrel support 13. As is a case of the reticle stage 5, three wafer stage interferometers 23 are arranged for the wafer stage 16. The wafer stage interferometers 23 are used for controlling the wafer stage 16 in the X, Y, and θ directions. According to the present exemplary embodiment, the Y direction is referred to as the scanning direction.

The stage surface plate 17 is levitated and positioned slightly above the base plate 18 similar to the barrel support 13. The stage surface plate 17 has a function of removing vibrations transmitted from the floor to the wafer stage 16 through the base plate 18 and a function of dampening a reaction force which is generated when the wafer stage 16 is driven and removing the force to the base plate 18. The wafer stage 16 is slightly levitated and mounted above the stage surface plate 17.

A reticle focus measurement unit 22 measures a position of a pattern-formed surface of the reticle 6 in the focus direction. The reticle 6 is, as described above, held to the reticle stage 5 by vacuum suction. The reticle focus measurement unit 22 has a plurality of measurement points arranged vertically with respect to the sheet surface of FIG. 1. The reticle focus measurement unit 22 measures a barycentric position (weighted center position) of the reflected light, as the focus detector 14 does. When the reticle stage 5 moves in the Y direction, position measurement by the reticle laser interferometers 10 becomes possible. The focus of the reticle pattern surface can be measured at an arbitrary position in the Y direction.

The focus measurement information of the reticle surface which is obtained by the reticle focus measurement unit 22 is stored in a storage device (not shown) and is used to correct the target position locus in the focus and tilt directions of the wafer stage 16 which performs a scan operation during the exposure of the wafer 21.

Figure 4:
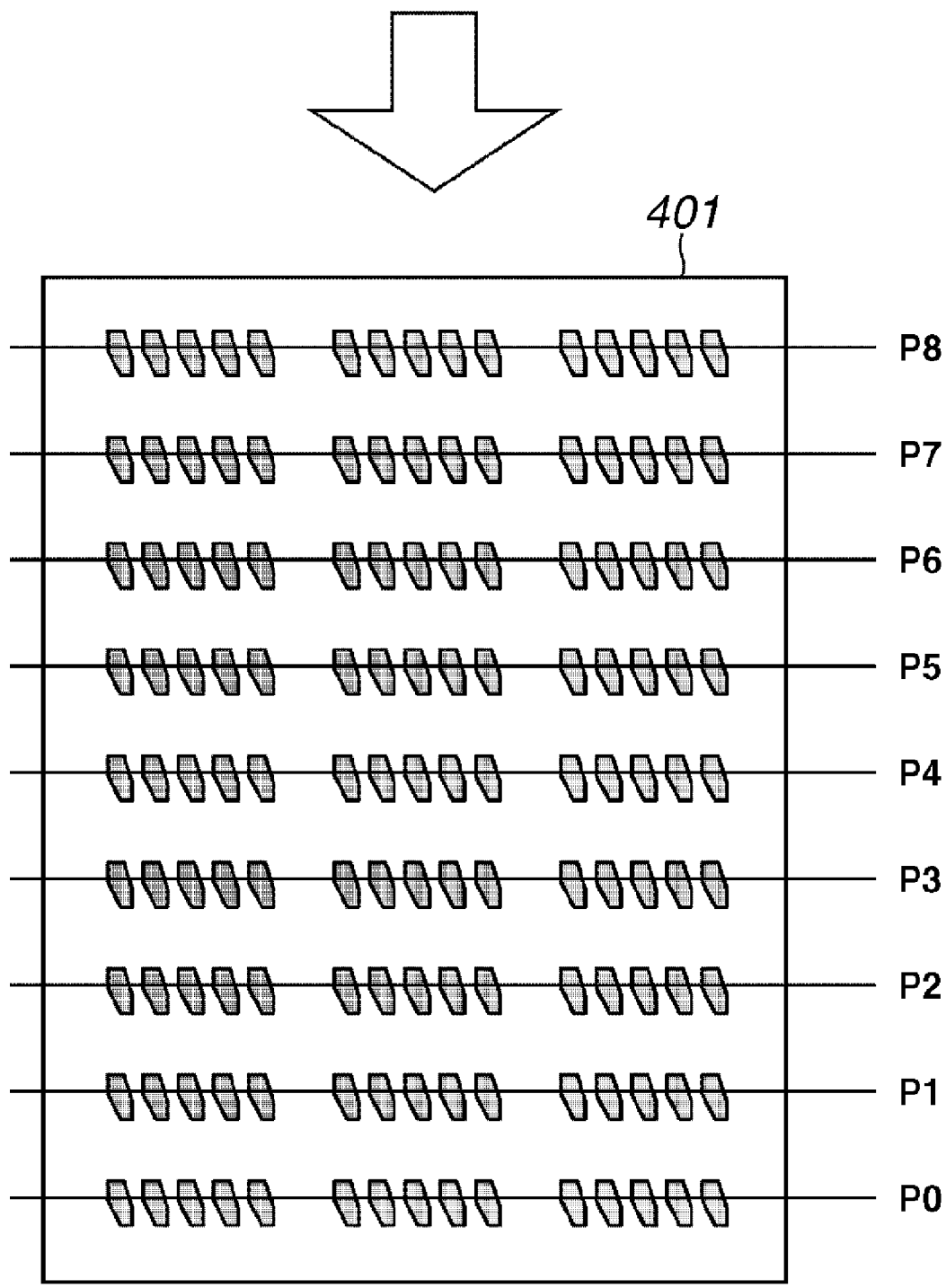
FIG. 4 illustrates a layout of focus measurement positions and focus measurement points in a shot area in a scanning exposure process.
Figure 5:
FIG. 5 illustrates a position of an exposure slit over the shot area and irradiation positions of the focus measurement points, wherein the exposure slit is fixed to the main body of the scanning exposure apparatus illustrated in FIG. 1.
Figure 5:
Figure 5:
Figure 5:
Figure 5:
Figure 5:
Figure 5:
Figure 5:
Figure 5:

FIG. 4 is a view showing a layout of the focus measurement points within an exposure shot area 401 when the exposure shot area 401 is scanned and exposed to exposure light. FIG. 5 illustrates the position of an exposure slit 501 fixed to the main body of the scanning exposure apparatus above the shot area and the irradiation position of the focus measurement points according to the present exemplary embodiment. When the wafer 21 is scanned downward with respect to the sheet surface of FIG. 5 during the scanning exposure, channels CH1, CH2, CH3, CH4, CH5, and CH6 are used as sensors for controlling the focus. Channels CH7, CH8, and CH9, and the channels CH4, CH5, and CH6 are used for scanning the wafer in the opposite direction.

It is assumed that the scanning direction in the scanning exposure according to the present exemplary embodiment is the Y-axis direction and that the wafer stage 16 can be driven to an arbitrary position in the XY plane. Further, the wafer stage 16 can be driven slightly in the focus direction of the projection lens 11 (Z direction).

The sensors CH1, CH2, and CH3, and the sensors CH7, CH8, and CH9 in their respective scanning directions are capable of measuring the focus before the exposure slit is moved over to the exposure area on the wafer, and thus, will be referred to as prefocus sensors. The channels CH4, CH5, and CH6, which are focus sensors arranged at the slit position, will be referred to as slit sensors.

Each channel includes a plurality of focus measurement marks, and an average of measurement values of each mark is the focus measurement value of the corresponding channel. For example, from the prefocus sensors CH1, CH2, and CH3, focus measurement values for three channels are obtained. The coordinate values (substrate surface positions) in the Z and ωy directions at the prefocus sensor measurement positions are calculated from the focus measurement values of the three channels and a known distance between the channels. The coordinate values can be used as data for controlling the focus. Focus measurement values of the slit sensors CH4, CH5, and CH6 and the prefocus sensors CH7, CH8, and CH9 are obtained in the same manner and used for controlling the focus.

Focus measurement during the scanning exposure is performed a number of times for each shot. FIG. 4 shows an example in which focus measurement points P0 to P8 are arranged with a 4-mm pitch in the exposure shot area 401 having a standard size (for example, the current standard is 26 mm×33 mm) for the scanning exposure apparatus. Since a layout span of the prefocus sensors and the slit sensors is set at 12 mm according to the present exemplary embodiment, the slit sensor measures a point which has been measured by the prefocus sensor by a delay of three cycles.

The exact position of a light projecting spot of a focus measurement light of the channels CH1 to CH9 is slightly shifted from a designed value due to a processing dimensional tolerance of a prism element used in the focus detector 14. This shift is reflected in carrying out correction when the focus of a specified shot (coordinates) on the wafer (an exposure target) is controlled or the specified spot is exposed to light and it is determined whether the measurement spots are located on the wafer.

In FIG. 4, the focus measurement points are defined as <P0> through <P8> in an order which the exposure slit passes a shot area when the wafer is observed from above. If the shot area is laid across the circumference of the wafer 21, a focus measurement unit (mark, channel, or point) located in an area outside the wafer or in a peripheral prohibited area is disabled based on the aforementioned determination. Thus, focus is not measured at the disabled measurement unit.

Figure 7:
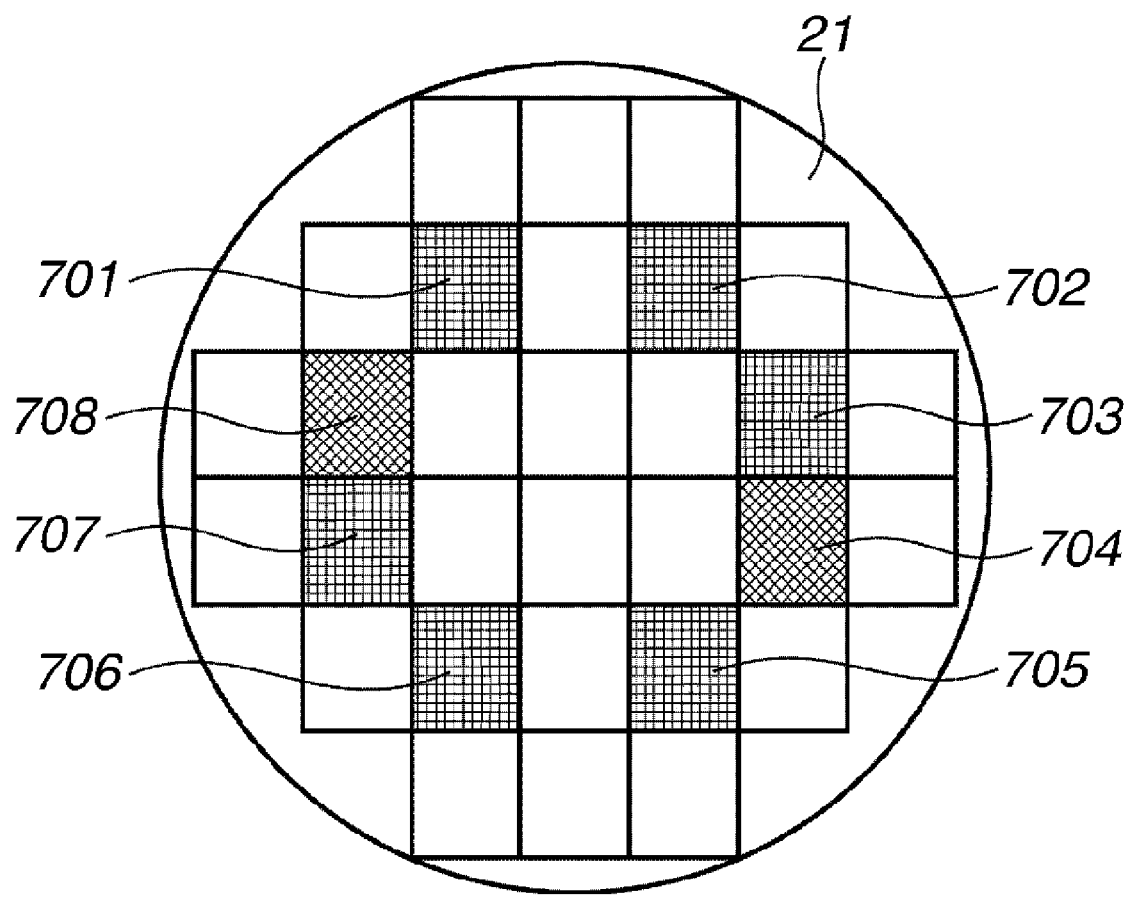
FIG. 7 illustrates an example of a layout of sample shots used for measuring a pattern offset of a processed wafer.

FIG. 7 illustrates an example of a layout of sample shots (701 through 708) which are used for measuring pattern offset of a processed wafer 21. The shots 704 and 708 are used also as sample shots for the prealignment measurement. In measuring the pattern offset, the sample shots 701 to 708 are scanned vertically with respect to the sheet surface of FIG. 7. The sample shots 701 to 708 are measured in such an order that the total time required for the measurement sequence is minimized.

Figure 6:
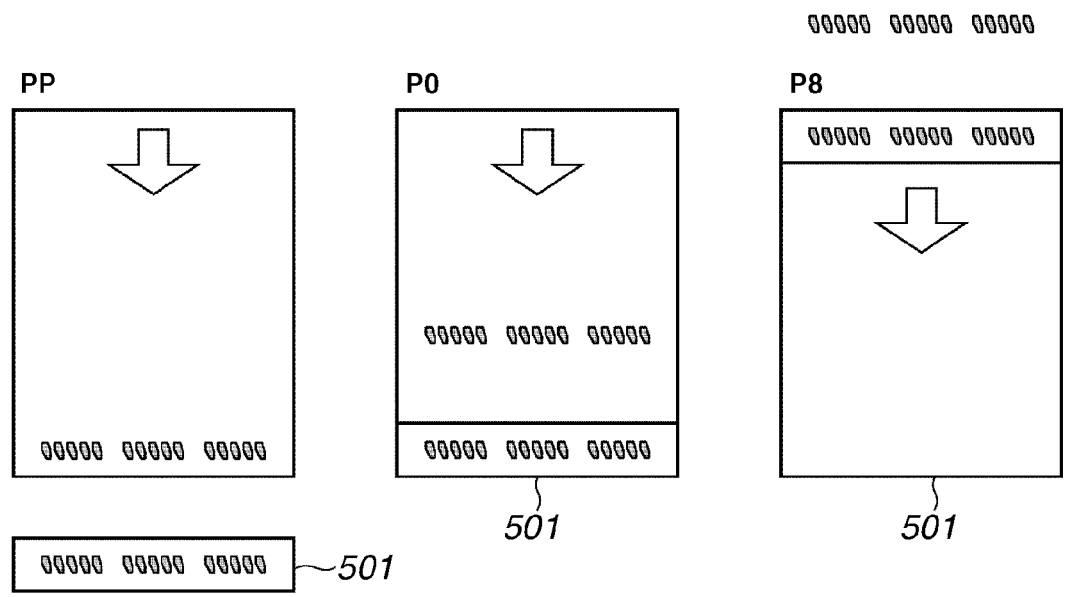
FIG. 6 illustrates a positional relation among the focus measurement spots, the exposure slit, and an exposure target shot area before and during the scanning exposure.

Next, general focus (and tilt) control will be described. FIG. 6 illustrates shot areas on the wafer, the focus measurement channels CH1 through CH9 of the focus measurement unit, the exposure slit 501, and the scanning direction (indicated by an arrow). In the general focus (and tilt) control, the focus measurement is performed in parallel with the scanning exposure.

Similar to FIG. 4, when the scanning exposure is performed and the scanning direction is the direction indicated by the arrow, before the exposure slit 501 is moved over to the exposure area, the focus measurement channels CH1 through CH3 measure the focus of the exposure area of the shot area (PP in FIG. 6). The focus measurement of such a case is referred to as prefocus measurement PP.

Based on the data obtained by the prefocus measurement PP, a necessary drive amount in the Z and ωy directions is calculated. Then a drive profile of the substrate plane is generated for eliminating a difference between the desired target value, and the focus and tilt measured at point PP before the slit sensors CH4 through CH6 reach the focus measurement points. The drive profile is a curve from points PP to P0. The drive profile will be the target locus of the wafer stage 16 in the Z and ωy axis directions.

When the wafer stage 16 is driven in the Y-axis direction, it is desirable that the position of the wafer plane in the Z and ωy directions is in parallel with a plane including the origin of the focus detector 14. In that case, when the scanning exposure phase reaches the point P0 in FIG. 6 and the wafer plane position is measured by slit sensors, it can be confirmed that the wafer plane position satisfies the desired control target value. According to the present exemplary embodiment, the running of the wafer stage 16 (origin plane) is adjusted to be in parallel with the origin plane of the focus detector 14 by a calibration sequence before the exposure processing sequence starts.

When the exposure phase enters the point P0, a control logic calculates a difference between the result of the measurement of the wafer plane with the slit sensors CH4 through CH6 and the desired control target value, and generates a profile that can resolve the calculated difference before the measurement of the focus measurement point P1 starts. Similar processing is repeated to the measurement point P8 which is the last exposure shot.

Regarding the measurement point P0, the focus measured by the slit sensors at the measurement point P0 is "0" since the difference from the focus target value measured by the prefocus sensors at the point PP is resolved. In this case, it is determined that correction of the focus target value of the wafer stage in the next drive is unnecessary. However, since the shot surface is tilted, until the sensors reach the next measurement point P1, a deviation from the focus target value may be generated. The deviation can be calculated by "distance corresponding to the tilt of the shot area"דfocus measurement pitch".

At point P2, the wafer stage is driven by such an amount that the deviation measured at the point P1 is resolved. However, a deviation which is newly generated while the sensors move from the point P1 to the point P2 is not resolved. Regarding such a problem, Japanese Patent Application Laid-Open No. 2005-129674 discusses a technique for improving capability of tracking a shot plane.

Figure 8A:
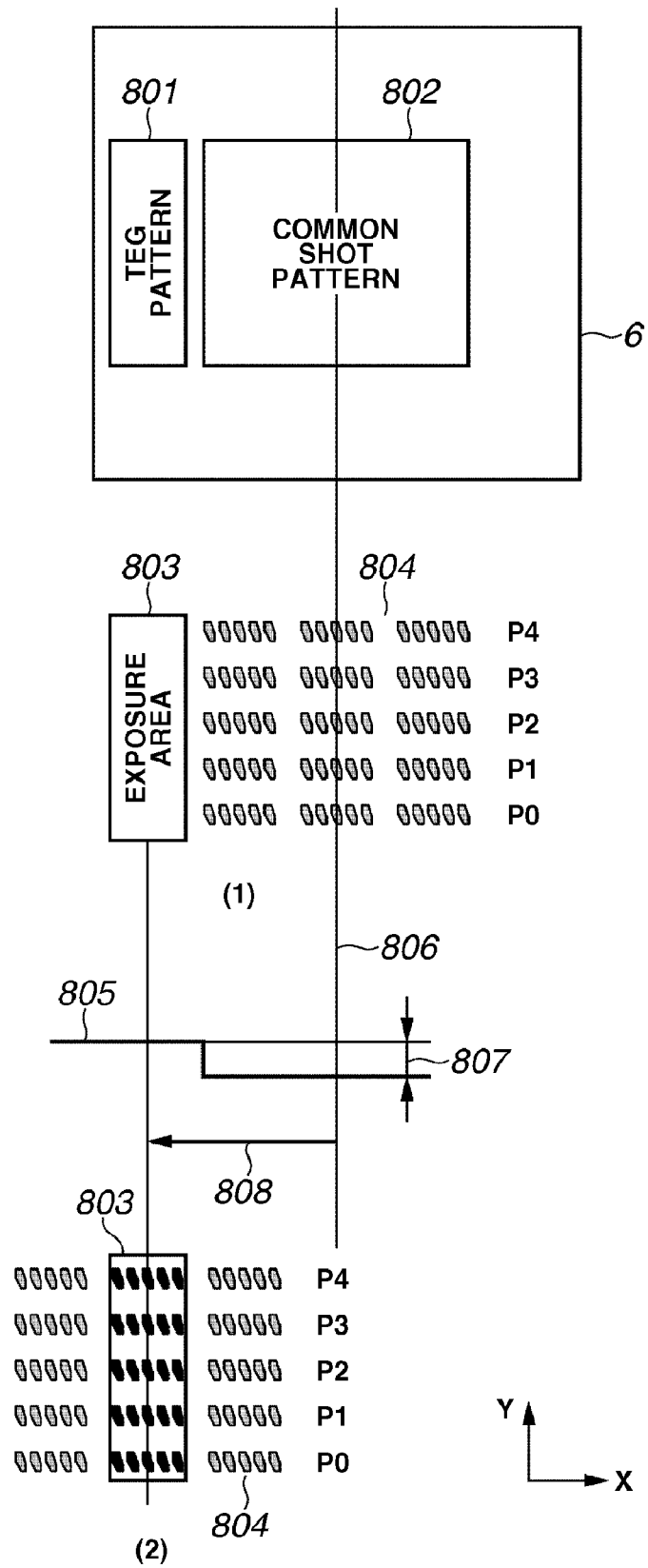
FIG. 8A illustrates an example of shifting of the focus measurement positions in the X direction.
Figure 8B:
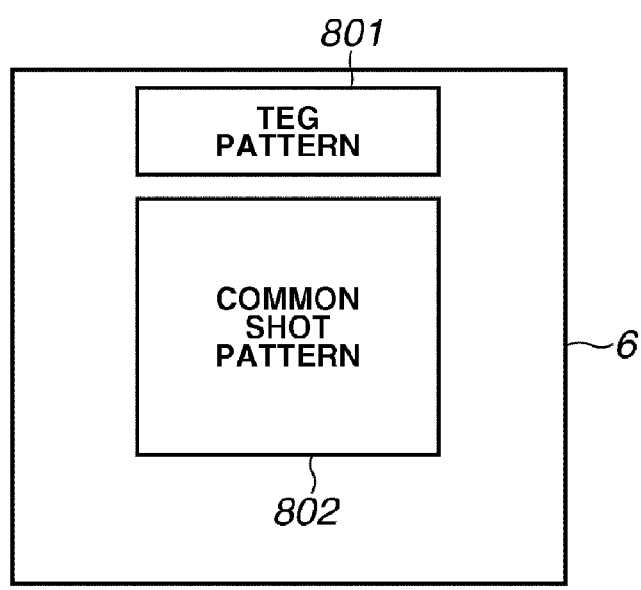
FIG. 8B illustrates an example of shifting of the focus measurement positions in the Y direction.
Figure 8B:
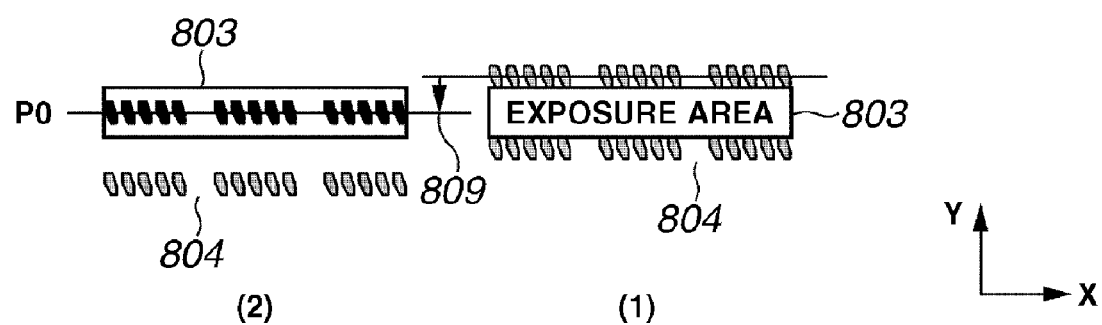

However, if the exposure area has a short X width and is away in the X direction from the center of the reticle as shown in FIG. 8A, or if the exposure area has a short Y width and is away in the Y direction from the center of the reticle as shown in FIG. 8B, proper focus measurement is not obtained.

In FIG. 8A, a common shot pattern 802 is arranged at the center portion of the reticle 6 and a TEG pattern 801 having a short X width is arranged away from the center of the reticle 6 in the X direction. Further, in FIG. 8B, a TEG pattern 801 having a short Y width is arranged away from the center of the reticle 6 in the Y direction.

If a TEG pattern 801 having a short X width and arranged away from the center of the reticle 6 in the X direction as shown in FIG. 8A (1) is exposed to exposure light, focus measurement sensors 804 will not be present in an exposure area 803. Thus, if a step 807 is formed on a wafer surface 805, proper focus measurement cannot be performed. In FIG. 8A, 806 denotes an X position of the wafer 21 when the exposure area 803 is exposed to the TEG pattern 801.

Further, if the exposure area 803 is exposed to a TEG pattern 801 having a short Y width and arranged away from the center of the reticle 6 in the Y direction as shown in FIG. 8B (1), the exposure area 803 may be positioned at an area between the focus measurement sensors 804. In this case, focus measurement points are not present. In these cases, as shown in FIGS. 8A (2) and 8B (2), the focus measurement points are shifted to points shown by the arrows 808 and 809 and measured. After that, the focus measurement points are moved back to the exposure position, and then the exposure is performed according to the present exemplary embodiment.

Figure 10:
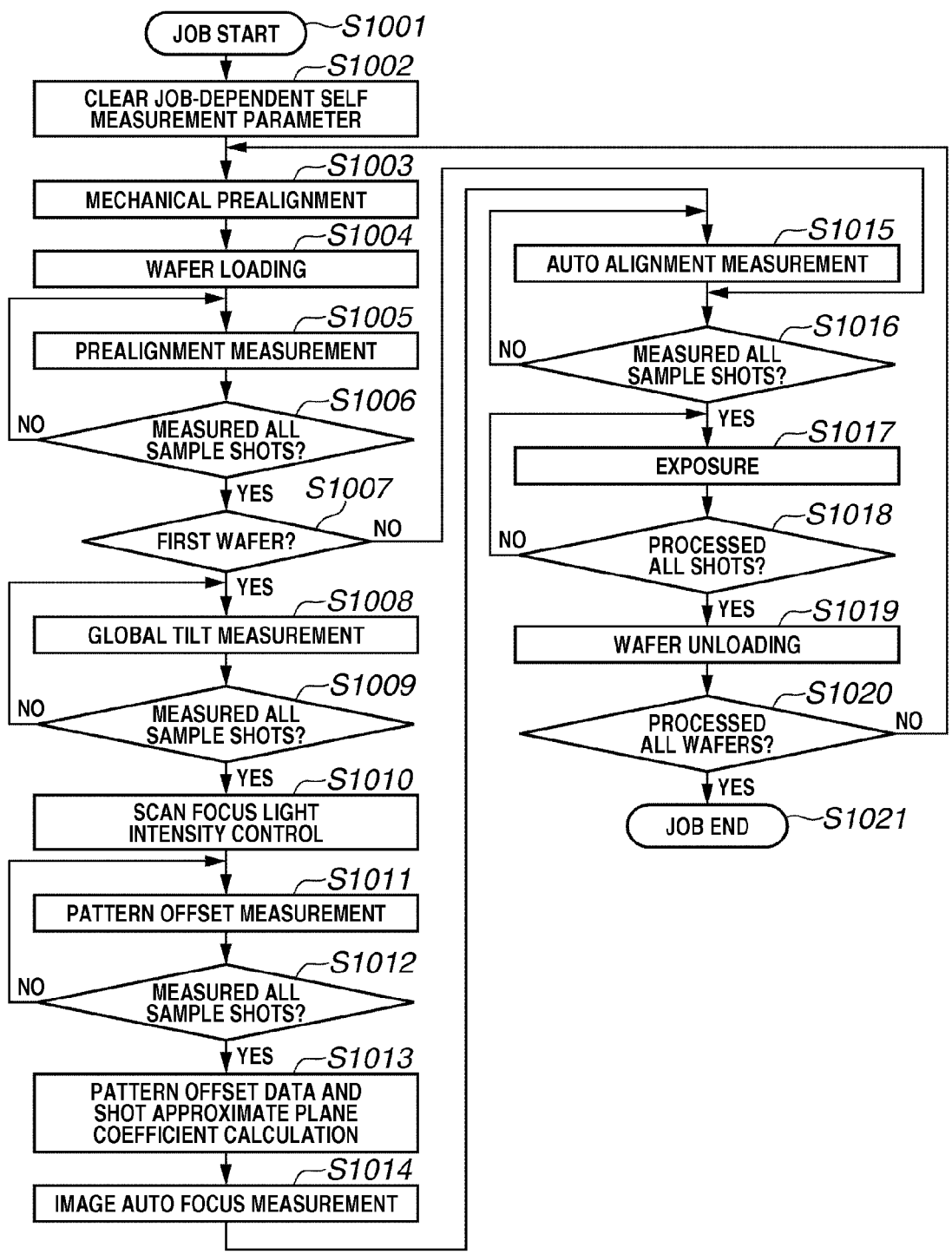
FIG. 10 is an example of a wafer exposure sequence of the scanning exposure apparatus illustrated in FIG. 1.
Figure 11:
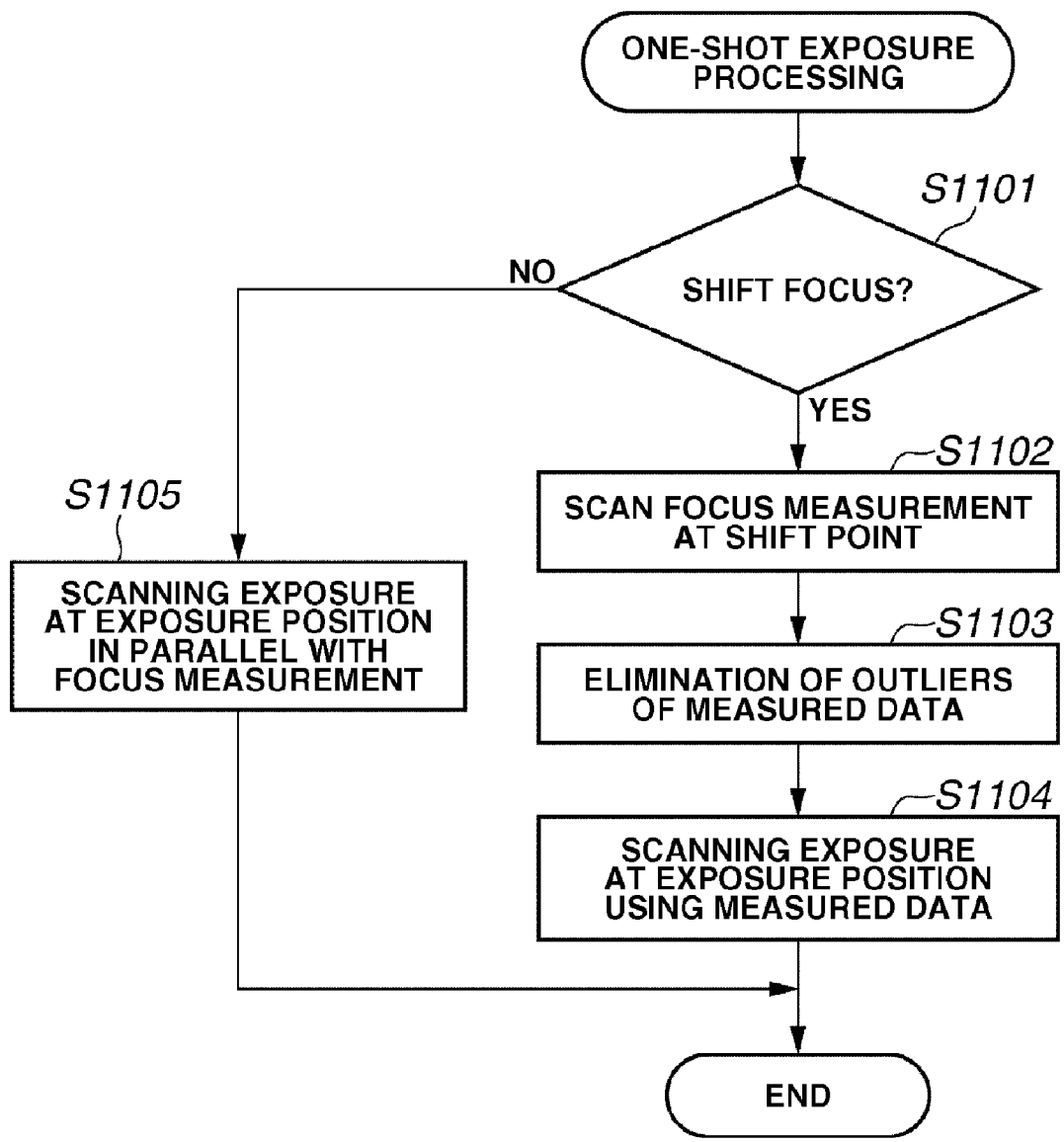
FIG. 11 is a flowchart illustrating details of an exposure process of a shot area described in the flowchart illustrated in FIG. 10.

This process is described referring to flowcharts in FIGS. 10 and 11.

FIG. 10 is a flowchart illustrating an example of a wafer exposure sequence according to an exemplary embodiment of the present invention. Processing of the wafer exposure sequence is performed by the console CPU 331, the main body CPU 321, or each unit.

In step S1001, the console CPU 331 starts a job specified by an operator or an on-line host. In step S1002, the console CPU 331 clears job-dependent measurement parameters including pattern offset data, the lighting control value for the focus measurement unit, and the best focus position of the alignment mark.

Next, in step S1003, before the wafer 21 is loaded on the wafer stage 16, the console CPU 331 mechanically prealigns the wafer 21. In this mechanical prealignment, an orientation flat or a notch formed on the wafer 21 is measured by a mechanical prealignment system (not shown) to roughly adjust the rotational position and central position of the wafer 21.

In step S1004, the console CPU 331 mounts the wafer 21 onto the wafer stage 16 by a conveyance robot (not shown). In steps S1005 and S1006, the process proceeds to a prealignment measurement loop in which the prealignment mark of the prealignment sample shots such as the shot 704 or 708 in FIG. 7 is measured.

In step S1007, the console CPU 331 determines whether the wafer 21 which is to be processed is the first wafer. If the wafer 21, which is to be processed, is a second or a later wafer (NO in step S1007), then steps S1008 through S1014 are skipped. That is, if the wafer 21 to be processed is the second or a later wafer, the pattern offset value and image auto focus measurement value obtained from the first wafer can be used for the subsequent wafers, and the parameter measurement process can be skipped.

Steps S1008 and S1009 constitute a global tilt measurement loop. In the global tilt measurement loop, central positions of the pattern offset measurement sample shots 701 through 708 are measured only by a single-lens, i.e., the slit sensor CH5. Further, a least-squares approximate plane (also referred to as a global tilt plane) is obtained from the central positions (X and Y coordinates) of the shot areas and positions defined by a measurement result of the focus (Z coordinate).

Step S1010 is a scan focus light intensity control sequence. In step S1010, the Y scanning is performed on one of the above-described shots 701 through 708 while the wafer 21 is aligned on the global tilt plane. The light intensity on the projecting side of the focus measurement unit is adjusted such that the intensity of the light measured during the scanning achieves desired precision.

Steps S1011 and S1012 constitute a pattern offset measurement loop. In steps S1011 and S1012, a pattern offset is measured in a predetermined scanning direction for each of the pattern offset measurement sample shots 701 through 708. The target values in the Z-, ωx-, and ωy-axis directions of the wafer stage 16 are set and fixed so that the above-described global tilt plane is placed in a horizontal position.

Step S1013 is a sequence for calculating a pattern offset correction table and a shot approximate plane coefficient. This sequence is performed by a method similar to a method which is described referring to FIG. 11 in Japanese Patent Application Laid-Open No. 2005-129674.

Step S1014 is an image auto focus measurement sequence in which a best focus position of each alignment mark in a plurality of alignment measurement sample shots (not shown) is obtained.

Steps S1015 and S1016 constitute an auto alignment measurement loop. Alignment of the second or a later wafer 21 is also measured through this loop.

Steps S1017 and S1018 constitute an exposure processing loop in which the wafer 21 is exposed to light while the focus is controlled (a shot surface of the wafer 21 which is to be exposed to light is driven so as to align with a pattern image-forming plane). In the exposure processing loop, the pattern offset correction table and the shot approximate plane coefficient calculated in step S1013 are reflected in the focus control. In step S1019, the exposure-finished wafer 21 is unloaded, recovered by a conveying system, and forwarded to the development process. In step S1020, if a number of wafers 21 predetermined by the job is all processed, then in step S1021, the job ends.

Next, a characteristic aspect of the exemplary embodiment of the present invention will be described referring to FIGS. 9, 11 and 12. The operations described below are processed by the console CPU 331, the main body CPU 321, or the focus detection system 327.

Figure 9:
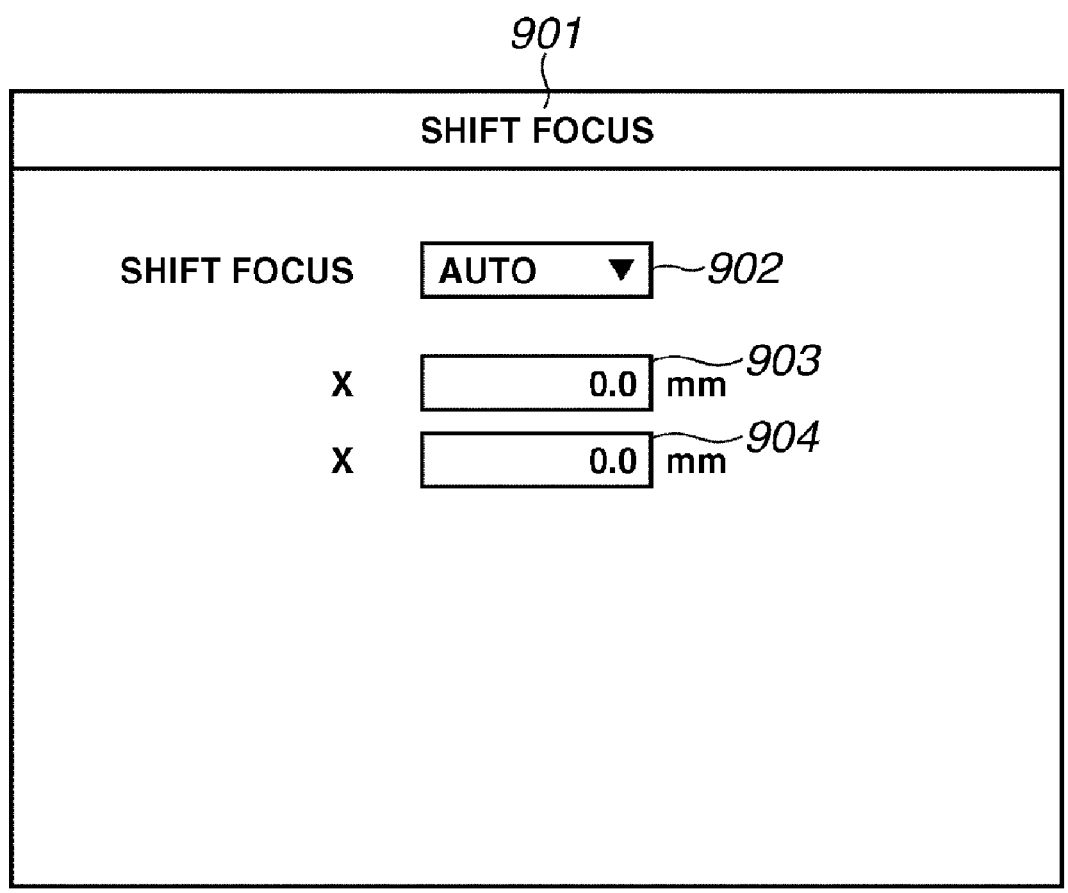
FIG. 9 illustrates an example of a shift focus parameter setting screen.

FIG. 9 shows a graphical user interface (GUI) screen used for setting parameters (information) related to the shift focus. The GUI is operated with the display 102 and the keyboard 104 (input device). In FIG. 9, a label 901 indicates that the screen is for inputting parameters for the shift focus. The screen shown in FIG. 9 is for selecting a shot and setting parameters for the shot.

A mode of the shift focus for the specified shot is selected using the shift focus mode selection dialog box 902. "Off" (no shift focus), "Manual" (manual input of shift position), and "Auto" (automatic calculation of the shift position) are selected from the shift mode selection dialog box 902. A dialog box 903 shows the X position of the shift position and a dialog box 904 shows the Y position of the shift position.

If "Off", which is a default setting, is selected from the shift focus mode selection dialog box 902, then the shift focus is not performed on the shot area. If "Manual" is selected from the shift focus mode selection dialog box 902, then the operator enters the X position (coordinate) of the shift position in the dialog box 903 and the Y position (coordinate) of the shift position in the dialog box 904. If "Auto" is selected from the shift focus mode selection dialog box 902, then the console CPU 331 automatically calculates the shift position based on a positional relation between the center of the reticle 6 and the exposure area, and the X and Y positions of the shift position are displayed in the dialog boxes 903 and 904.

Further, if "Auto" is selected, the dialog boxes 903 and 904 only display the X and Y positions and the operator is unable to enter any positions into the boxes. In the "Auto" mode, the X and Y positions of the shift position displayed in the dialog boxes 903 and 904 are recalculated by the console CPU 331 when the parameters are sent from the console unit to the main body. This is to maintain alignment in a case where other parameters are changed after the shift focus mode is selected from the shift focus mode selection box 902. In FIG. 9, parameters related to the shift focus are set for each shot, however, if the shots are in the same TEG, the parameters of such shots may be set at a time.

FIG. 11 is a flowchart illustrating details of the step S1017 in FIG. 10. In step S1101, if the shift focus mode selection dialog box 902 is "Off" (NO in step S1101), then the process proceeds to step S1105 and the normal exposure is performed. If the shift focus mode selection dialog box 902 is "Manual" or "Auto" (YES in step S1101), then the process proceeds to step S1102 and the exposure using the shift focus is performed. In step S1105, the console CPU 331 performs the normal focus, the tilt control, and the exposure processing which are described above referring to FIG. 6. In step S1102, the scan focus measurement is performed at the shift position whose X and Y positions are displayed in the dialog boxes 903 and 904. At this time, the focus (plane position) is measured while the stage is scanned but the time shift focus drive is not carried out.

According to the example shown in FIG. 8A, before the exposure is performed at the position (1), the console CPU 331 shifts the wafer stage to travel a distance shown by an arrow 808 in the X direction to the position (2) where the focus can be measured in the exposure area 803, and measures the focus during scanning but does not measure the Z and tilt driving. Since only the focus measurement points within the exposure area 803 are normally measured, only the marks in the exposure area 803 are effective. According to the example shown in FIG. 8A, the center channel is the only effective channel, and thus the focus is measured by the center channel. Further, in the case of FIG. 8B, the console CPU 331 shifts the wafer stage to travel a distance shown by an arrow 809 in the Y direction to the position (2) where the focus can be measured in the exposure area 803, and measures the focus during scanning but does not measure the Z and tilt driving.

In step S1103, the console CPU 331 removes the outliers of the data obtained in step S1102. In step S1104, the console CPU 331 calculates an optimum focus using the outlier-removed data, performs the Z and the tilt driving using the data, and performs exposure of the area.

According to the aforementioned examples, exposure is performed at the positions shown in FIG. 8A (1) and FIG. 8B (1). Naturally, correction of the measured value in the Z- and ωy-axis directions becomes necessary in calculating the optimum focus value due to a tilt of the shot area.

Figure 12:
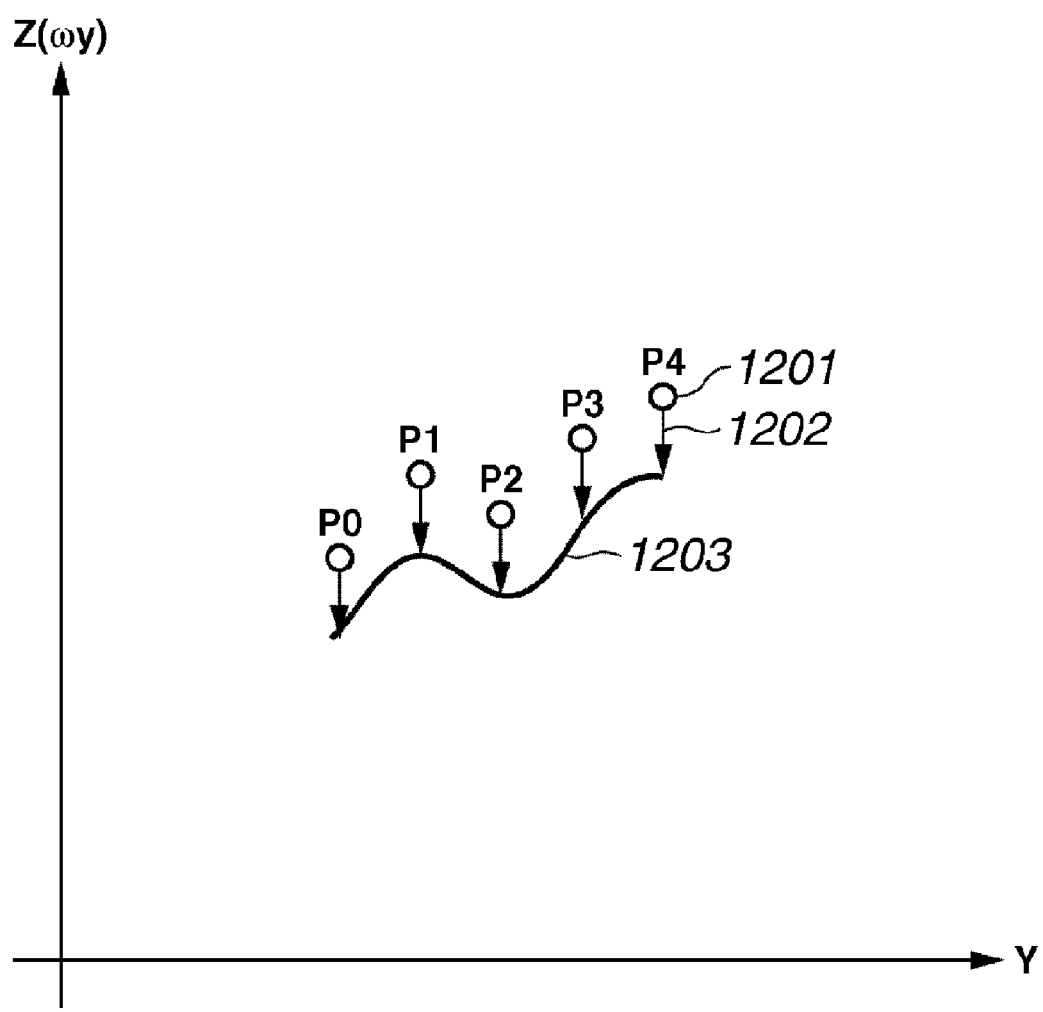
FIG. 12 is a graph illustrating an example of a measurement value when the shift focus is implemented and a drive amount at the time of exposure by the scanning exposure apparatus illustrated in FIG. 1.

FIG. 12 is a graph illustrating an example of a measurement value when the shift focus is implemented, and a drive amount at the time of exposure.

In FIG. 12, the case shown in FIG. 8A is taken as an example. In the downward scanning in FIG. 8A, the sensor groups CH1 through CH3 and the sensor groups CH4 through CH6 measure data at the measurement points P0 through P4 in the shifted shot area and the measurement data for each measurement point is obtained by the sensors. The obtained measurement data is directly converted to Z and ωy components of measurement data for each sensor group. The effective sensors are the sensors CH2 and CH5 which are on the exposure area 803. Similarly, in the upward scanning in FIG. 8A, the sensor groups CH7 through CH9 and the sensor groups CH4 through CH6 measure data and the measurement data for each measurement point is obtained by the sensors. The effective sensors are the sensors CH8 and CH5 which are on the exposure area 803. The focus measurement data obtained for each measurement point in shift focus measurement is represented by an open dot 1201 in FIG. 12.

In shifting the focus measurement 1201 for the exposure area in FIG. 8A (2) to the exposure position of the exposure area 803 in FIG. 8A (1), it is necessary to make a correction in the Z and ωy directions due to a tilt of the shot area by the correction amount 1202. The drive amount of the wafer stage for exposure in the position shown in FIG. 8A (1) will be calculated, for example, by a method of moving average and is represented by 1203. This is based on an example of measured values in the Z-axis direction obtained by the sensor group CH2. This is the same with other sensor groups and control axes.

The focus (plane position) measurement is performed while the stages are scanned but the time shift focus drive is not carried out according to the present exemplary embodiment. However, the focus (plane position) measurement may be performed while the stages are scanned and with the time shift focus drive. Further, the time shift focus drive (focus control) may be performed based on both the measurement values of the shift focus measurement and the scan drive focus measurement. In this case, the drive amount added to the measured value corresponds to the focus measurement 1201 of the present exemplary embodiment.

According to the scanning exposure apparatus of the present exemplary embodiment, optimum focus can be calculated by moving the wafer stage to the area where the reticle pattern is transferred and measuring the focus while scanning the wafer. By Z driving or tilt driving using the optimum focus information and performing scanning exposure at the exposure position, the focus measurement point is prevented from overlaying the scribe line. Further, focus measurement of special exposure areas such as TEG can be performed with precision which enables precise patterning.

Figure 13:
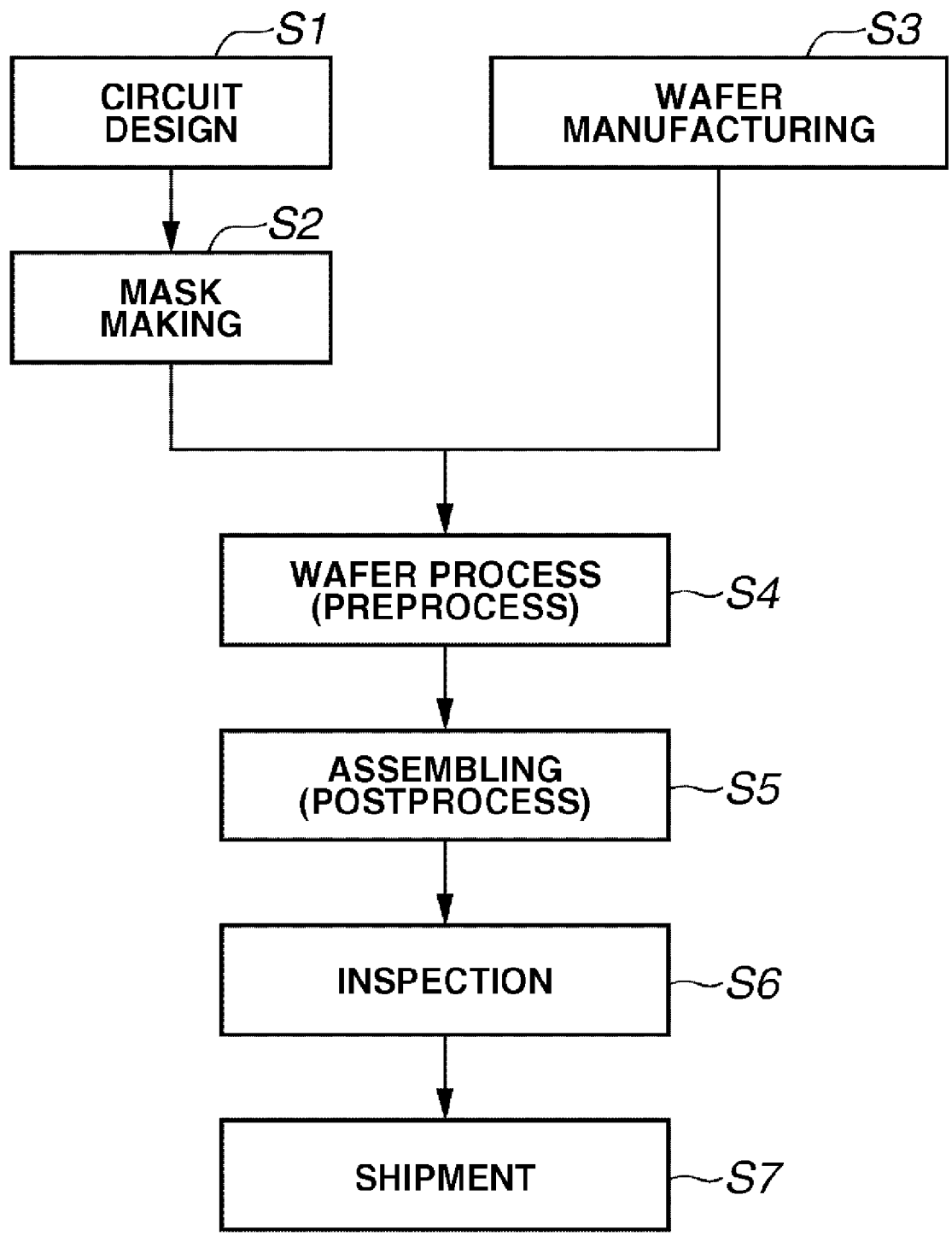
FIG. 13 is a flowchart describing a device manufacturing method using the scanning exposure apparatus illustrated in FIG. 1.

FIG. 13 is a flowchart illustrating exemplary manufacturing processes for a semiconductor device (e.g., an integrated circuit (IC), a large scale integration (LSI), a liquid crystal display (LCD), and a charge-coupled device (CCD)).

Step S1 is a circuit design process for designing a circuit of a semiconductor device. Step S2 is a mask making process for fabricating a mask, which can be referred to as an original plate or a reticle, based on a designed circuit pattern. Step S3 is a wafer manufacturing process for manufacturing a wafer, which can also be referred to as a substrate, from a silicon or comparable material. Step S3 can be a reticle manufacturing process. Step S4 is a wafer process, which can be referred to as "preprocess", for forming an actual circuit on a wafer using an exposure apparatus with the above-described prepared mask according to the lithography technique. Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

Figure 14:
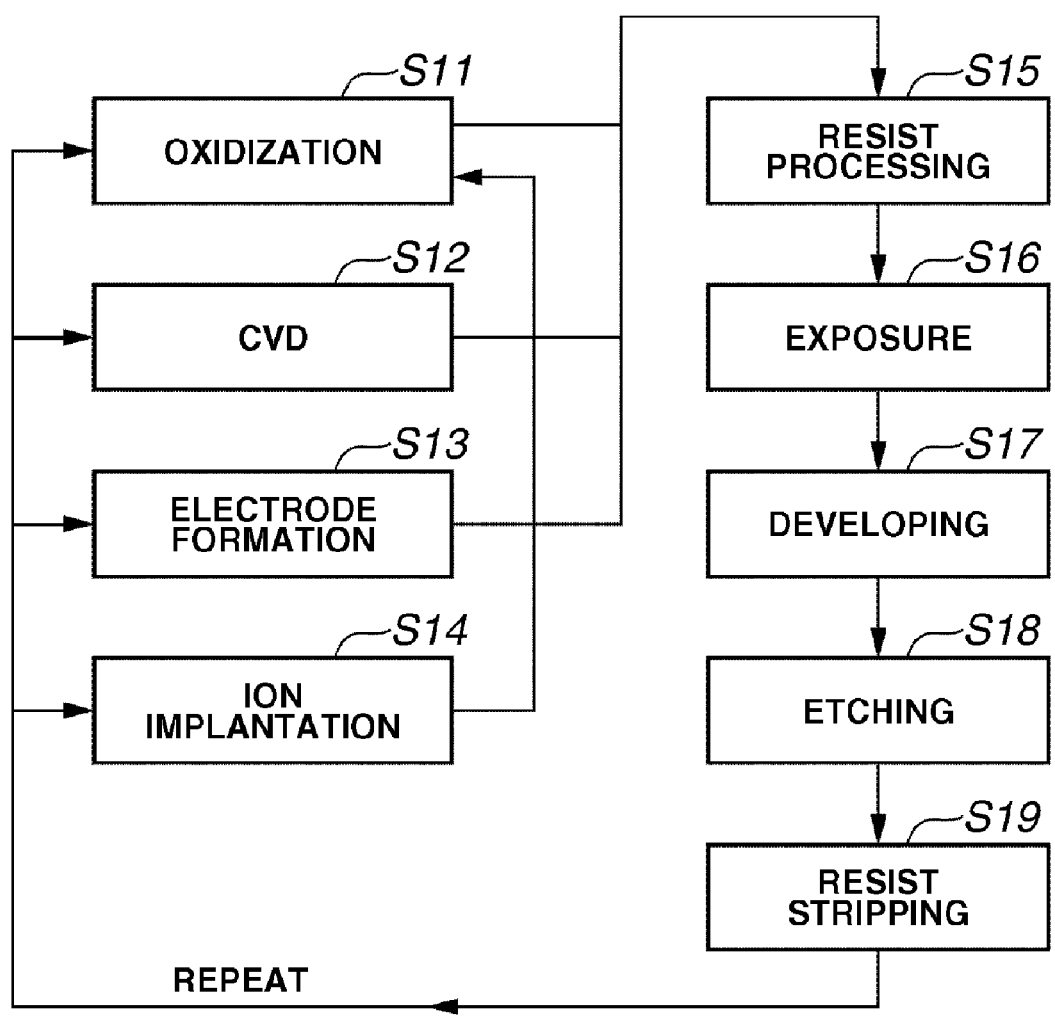
FIG. 14 is a flowchart describing a wafer process.

FIG. 14 is a flowchart describing the above wafer process in step S4. The wafer process in step S4 includes an oxidation step S11 for oxidizing a wafer surface, a chemical vapor deposition (CVD) step S12 for forming an insulating film on the wafer surface, and an electrode formation step S13 for forming electrodes on the wafer by vaporization. Furthermore, the wafer process in step S4 includes an ion implantation step S14 for implanting ions into the wafer, a resist processing step S15 for coating the wafer with a photosensitive material, and an exposure step S16 for exposing the wafer subjected to the resist processing step to light using the above-described exposure apparatus with a mask having a circuit pattern. Furthermore, the wafer process in step S4 includes a developing step S17 for developing the wafer exposed in the exposure step S16, an etching step S18 for cutting off a portion other than a resist image developed in the developing step S17, and a resist stripping step S19 for removing an unnecessary resist remaining after the etching step S18. The processing repeating the above-described steps can form multiple circuit patterns on a wafer.

According to the above-described exemplary embodiment, the focus measurement point is prevented from overlaying the scribe line and precise focus adjustment can be performed. Further, precise focus adjustment can also be performed on special exposure areas such as TEG.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-117897 filed Apr. 27, 2007, which is hereby incorporated by reference herein in its entirety.

What is claimed is:

1. An exposure apparatus configured to expose a substrate to radiant energy via an original plate while scanning of the original plate and the substrate are performed, the apparatus comprising:

a projection optical system configured to project light from the original plate onto the substrate;

an original plate configured to hold the original plate and to be moved;

a substrate stage configured to hold the substrate and to be moved;

a measurement device configured to measure a position of a surface of a substrate facing the projection optical system in a direction of an optical axis of the projection optical system;

a processor configured to control a movement of the original plate stage, a movement of the substrate stage, and an operation of the measurement device; and an input device configured to input information about a measurement portion in the surface to be measured by the measurement device, wherein the processor is configured to cause the measurement device to perform measurement of a position of the surface with respect to a measurement portion determined by the information, to cause the scanning to start after the measurement, and to cause the substrate stage to move in the direction of the optical axis during the scanning based on the position of the surface obtained by the measurement.

2. An apparatus according to claim 1, further comprising a display, wherein the processor is configured to cause the display to display a user interface used for inputting the information.

3. An apparatus according to claim 1, wherein the processor is configured to cause the measurement device to perform the measurement of the position of the surface during the scanning, and to cause the substrate stage to move in the direction of the optical axis during the scanning further based on the position of the surface obtained by the measurement during the scanning.

4. An apparatus according to claim 1, wherein the processor is configured to calculate the measurement portion based on the information.

5. A method for manufacturing a device utilizing an exposure apparatus configured to expose a substrate to light via an original plate while scanning of the original plate and the substrate are performed, the apparatus including a projection optical system configured to project light from the original plate onto the substrate; an original plate stage configured to hold the original plate and to be moved; a substrate stage configured to hold the substrate and to be moved; a measurement device configured to measure a position of a surface of the substrate facing the projection optical system in a direction of an optical axis of the projection optical system; a processor configured to control a movement of the original plate stage, a movement of the substrate stage, and an operation of the measurement device; and an input device configured to input information about a measurement portion in the surface to be measured by the measurement device, wherein the processor is configured to cause the measurement device to perform measurement of a position of the surface with respect to a measurement portion determined by the information, to cause the scanning to start after the measurement, and to cause the substrate stage to move in the direction of the optical axis during the scanning based on the position of the surface obtained by the measurement, the method comprising:

exposing a substrate to radiant energy using the exposure apparatus;

developing the exposed substrate; and processing the developed substrate to manufacture the device.

* * * * *